US009988709B2

(12) United States Patent
Hisano et al.

(10) Patent No.: US 9,988,709 B2
(45) Date of Patent: Jun. 5, 2018

(54) SINTERED COMPACT MAGNESIUM OXIDE TARGET FOR SPUTTERING, AND METHOD FOR PRODUCING SAME

(71) Applicant: JX Nippon Mining & Metals Corporation, Tokyo (JP)

(72) Inventors: Akira Hisano, Ibaraki (JP); Yuichiro Nakamura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 269 days.

(21) Appl. No.: 14/356,395

(22) PCT Filed: Dec. 25, 2012

(86) PCT No.: PCT/JP2012/083391
§ 371 (c)(1),
(2) Date: May 6, 2014

(87) PCT Pub. No.: WO2013/099832
PCT Pub. Date: Jul. 4, 2013

(65) Prior Publication Data
US 2014/0284212 A1    Sep. 25, 2014

(30) Foreign Application Priority Data
Dec. 27, 2011 (JP) ................. 2011-285757

(51) Int. Cl.
C23C 14/00 (2006.01)
C23C 14/34 (2006.01)
C04B 35/053 (2006.01)
C04B 35/645 (2006.01)
C23C 14/08 (2006.01)

(52) U.S. Cl.
CPC ........ *C23C 14/3407* (2013.01); *C04B 35/053* (2013.01); *C04B 35/645* (2013.01);
(Continued)

(58) Field of Classification Search
None
See application file for complete search history.

(56) References Cited

U.S. PATENT DOCUMENTS 6,056,857 A * 5/2000 Hunt ..................... C23C 14/564
148/577
6,500,321 B1* 12/2002 Ashtiani ............. C23C 14/3407
204/298.03

(Continued)

FOREIGN PATENT DOCUMENTS

CN          1326909 A     12/2001
CN        101575203 A     11/2009
(Continued)

OTHER PUBLICATIONS

S.M. Zubakov et al., Sintering Magnesium Oxide Made From Magnesium Hydroxycarbonate. May 1979, vol. 20, Issue 5, pp. 311-315.*

*Primary Examiner* — Timon Wanga
(74) *Attorney, Agent, or Firm* — Howson & Howson LLP

(57) ABSTRACT

A sintered compact magnesium oxide target for sputtering having a purity of 99.99 wt % or higher excluding C, a density of 3.57 g/cm$^3$ or higher, and a whiteness of 60% or less. In order to uniformly deposit a magnesium oxide film, a magnesium oxide target having a higher purity and a higher density is being demanded. An object of this invention is to provide a target capable of realizing the above, and a method for producing such a target. While a magnesium oxide sintered compact sputtering target is produced by hot-pressing a raw material powder, there is a problem in that color shading occurs in roughly φ60 (within a circle having a diameter of 60 mm) at the center part of the target. Conventionally, no particularly attention was given to this (Continued)

problem. However, in recent years, it has become necessary to investigate and resolve this problem in order to improve the deposition quality.

6 Claims, 1 Drawing Sheet

(52) U.S. Cl.
 CPC ........ *C23C 14/081* (2013.01); *C23C 14/3414* (2013.01); *C04B 2235/442* (2013.01); *C04B 2235/5445* (2013.01); *C04B 2235/721* (2013.01); *C04B 2235/77* (2013.01); *C04B 2235/81* (2013.01); *C04B 2235/9646* (2013.01); *C04B 2235/9661* (2013.01)

(56) References Cited

U.S. PATENT DOCUMENTS

| | | | |
|---|---|---|---|
| 6,652,668 B1* | 11/2003 | Perry | C22F 1/10 148/120 |
| 8,454,933 B2 | 6/2013 | Nagano et al. | |
| 2005/0045065 A1* | 3/2005 | Sakurai | C04B 35/053 106/286.8 |
| 2008/0245656 A1* | 10/2008 | Watanabe | C23C 14/10 204/192.1 |
| 2010/0294657 A1* | 11/2010 | Nagano | C04B 35/043 204/298.13 |
| 2011/0143460 A1 | 6/2011 | Tsunekawa et al. | |
| 2012/0286219 A1* | 11/2012 | Ikisawa | C23C 14/0623 252/514 |

FOREIGN PATENT DOCUMENTS

| | | |
|---|---|---|
| CN | 102198954 A | 9/2011 |
| CN | 102212781 A | 10/2011 |
| JP | 10-130827 A | 5/1998 |
| JP | 10-130828 A | 5/1998 |
| JP | 10-158826 A | 6/1998 |
| JP | 10-237636 A | 9/1998 |
| JP | 11-006058 A | 1/1999 |
| JP | 11-139862 A | 5/1999 |
| JP | 11-335824 A | 12/1999 |
| JP | 2000-169956 A | 6/2000 |
| JP | 2003-055759 A | 2/2003 |
| JP | 2008189493 A | 8/2008 |

* cited by examiner

SINTERED COMPACT MAGNESIUM OXIDE TARGET FOR SPUTTERING, AND METHOD FOR PRODUCING SAME

BACKGROUND

The present invention relates to a magnesium oxide target for use in forming a magnesium oxide layer for magnetic recording mediums of magnetic disk devices or tunneling magnetoresistance (TMR) elements and other electronic devices, and to the method of producing such a magnesium oxide target; and particularly relates to a sintered compact magnesium oxide target for sputtering of high purity and high density and which is free of color shading that occurs at the center of the target, and to the method of producing such a sintered compact magnesium oxide target for sputtering.

In recent years, pursuant to the downsizing and higher recording density of magnetic disks, research and development of magnetic recording mediums are being conducted, and in particular Co-based magnetic layers and under-layers have been improved variously.

Meanwhile, the recording density of hard disks has been increasing rapidly year by year, and it is considered that current surface density of 600 Gbit/in$^2$ will reach 1 Tbit/in$^2$ in the future. When the recording density reaches 1 Tbit/in$^2$, the recording bit size will be less than 10 nm and, in such a case, it is anticipated that the superparamagnetism caused by thermal fluctuation will become a problem. The currently used magnetic recording medium structure such as a structure with increased magnetic crystalline anisotropy obtained by adding Pt to a Co—Cr-based alloy will become insufficient.

This is because magnetic particles that behave with stable ferromagnetism at a size of 10 nm or less require even greater magnetic crystalline anisotropy.

Due to the foregoing reason, a Fe—Pt phase having an $L1_0$ structure is attracting attention as a structure for use in an ultra high density recording medium. Since the Fe—Pt phase having an $L1_0$ structure possesses high magnetic crystalline anisotropy in addition to yielding superior corrosion resistance and oxidation resistance, it is expected to be a structure that can be suitably applied to a magnetic recording medium.

When using a Fe—Pt layer as a structure for use in an ultra high density recording medium, it is demanded to develop a technology of dispersing ordered Fe—Pt magnetic particles regulated in the same direction with a density as high as possible in a magnetically isolated state. While it is necessary to control the crystal orientation in order to provide magnetic anisotropy to the Fe—Pt thin film, this can be easily performed by selecting a single crystal substrate. In order to vertically align an easy axis, it has been reported that a magnesium oxide film is suitable as the under-layer of the Fe—Pt layer.

In addition, it is also known that a magnesium oxide film can be suitably used as the insulating layer, i.e., tunnel barrier of a TMR element that is used in a magnetic head (for hard disks) or an MRAM. While the foregoing magnesium oxide film has been conventionally formed via the vacuum deposition method, in recent years the sputtering method is being used to produce magnesium oxide films from the perspective of simplification of the production process and facilitation of the production of large screens.

There are the following publications as conventional technology.

Patent Document 1 describes a magnesium oxide target made from a magnesium oxide sintered compact having a magnesium oxide purity of 99.9% or higher than a relative density of 99% or higher, wherein the magnesium oxide target has a fine structure in which the average grain size is 60 µm or less and round pores having an average grain size of 2 µm or less exist in the crystal grains, and is compatible up to a sputter deposition rate of 1000 Å/min or more. This technique is based on a method of adding fine magnesium oxide powder having an average grain size of 100 nm or less to high purity magnesium oxide powder and mixing and compacting the powders, and subjecting the obtained compact to primary sintering and secondary sintering.

Patent Document 2 relates to a magnesium oxide target made from a magnesium oxide sintered compact having a relative density of 99% or higher and capable of achieving a deposition rate of 500 Å/min or higher in sputter deposition performed in an Ar atmosphere or Ar—$O_2$ mixed atmosphere, and proposes compacting high purity magnesium oxide powder having an average grain size of 0.1 to 2 µm based on CIP at a pressure of 3 t/cm$^2$ or higher, and sintering the obtained compact.

Patent Document 3 describes a magnesium oxide target made from a magnesium oxide sintered compact having a magnesium oxide purity of 99.9% or higher and a relative density of 99.0% or higher, and compatible up to a sputter deposition rate of 600 Å/min or more. This technique is based on a method of adding electromelted magnesium oxide powder and fine magnesium oxide powder having an average grain size of 100 nm or less to high purity magnesium oxide powder and mixing and compacting the powders, and subjecting the obtained compact to primary sintering and secondary sintering. Patent Document 3 describes that a magnesium oxide film having favorable orientation, crystallinity and film properties can be deposited via the sputtering method at a high deposition rate.

Patent Document 4 describes a target having MgO as its main component, as well as a method for producing such a target, and proposes dispersing La particles, Y particles and Sc particles in a target having MgO as its main component for use as a protective film of a dielectric layer of an Ac-type PDP in order to achieve a low discharge voltage, sputtering resistance during discharge, quick responsiveness to discharge, and insulation properties.

Patent Document 5 proposes, in a target having MgO as its main component, dispersing $LaB_6$ particles in the MgO matrix, performing reduction treatment in a reduced gas atmosphere prior to sintering, and performing primary sintering and secondary sintering at a predetermined temperature in order to improve the strength, fracture toughness value, and resistance to thermal shock.

Patent Document 6 prescribes the relative density and the average crystal grain size to be 0.5 to 100 µm in a target having MgO as its main component, and dispersing the rare earth elements of Sc, Y, La, Ce, Gd, Yb, and Nd in the MgO matrix.

Patent Document 7 proposes sintering a MgO green compact based on the spark plasma sintering method in order to produce a high density sintered compact.

Patent Document 8 and Patent Document 9 describe methods of obtaining a MgO sintered compact with numerous (111) planes aligned based on uniaxial pressure sintering and having an ultimate density of 3.568 g/cm$^3$ so as to achieve favorable mechanical property and thermal conductivity, and reduction in contamination of the atmosphere caused by the generation of gas, and propose subjecting MgO raw material powder having a grain size of 1 µm or less to uniaxial pressure sintering, and subsequently performing heat treatment in an oxygen atmosphere at a temperature of 1273 K or higher. In the foregoing case, MgO is used as the raw material powder, and the method of increasing the density is limited to the sintering conditions.

Patent Document 10 proposes a target for depositing a MgO film in a large size and uniform manner. In addition to prescribing the average crystal grain size, the density, the deflective strength, and the center line average roughness of the target surface, Patent Document 10 proposes causing the grain size of the raw material powder to be 1 μm or less, subjecting the raw material powder to granulation, sintering the granulated raw material powder at a predetermined load and temperature, and finishing the surface of the target to achieve a center line average roughness Ra of 1 μm or less. Incidentally, while not directly related to the present invention, foregoing Patent Document 1 to Patent Document 6, Patent Document 8, and Patent Document 9 describe the evaluation of the "bending strength" of a target, and Patent Document 10 describes the evaluation of the "deflective strength" of a target.

CITATION LIST

Patent Documents

Patent Document 1: JP-A-H10-130827
Patent Document 2: JP-A-H10-130828
Patent Document 3: JP-A-H10-158826
Patent Document 4: JP-A-H10-237636
Patent Document 5: JP-A-H11-6058
Patent Document 6: JP-A-H11-335824
Patent Document 7: JP-A-H11-139862
Patent Document 8: JP-A-2009-173502
Patent Document 9: WO2009/096384
Patent Document 10: JP-A-2000-169956

SUMMARY OF THE INVENTION

In recent years, the use of a magnesium oxide film in recording mediums of magnetic disk devices (hard disks) or tunneling magnetoresistance (TMR) elements and other electronic devices is being considered, but a magnesium oxide target having a higher purity and a higher density is being demanded in order to uniformly deposit a magnesium oxide film. Nevertheless, since expectations for higher purification and densification are extremely high, it was conventionally difficult to produce a magnesium oxide target capable of meeting the foregoing demands. Thus, an object of this invention is to provide a target capable of realizing the above, and a method for producing such a target.

Moreover, while a magnesium oxide sintered compact sputtering target is produced by hot-pressing a raw material powder, there is a problem in that color shading occurs in roughly φ60 (within a circle having a diameter of 60 mm) at the center part of the target. Conventionally, no particularly attention was given to this problem. However, in recent years, it has become necessary to investigate and resolve this problem in order to improve the deposition quality.

In order to achieve the foregoing object, as a result of intense study, the present inventors discovered that a magnesium oxide target having a higher purity and a higher density can be obtained with inexpensive processing conditions in comparison to conventional methods based on the selection of raw material powders and the optimal setting of sintering conditions. In addition, with respect to the occurrence of color shading, the present inventors additionally discovered that it is possible to produce a uniformly gray magnesium oxide target that is free of color shading, and which comprises a moderate oxygen defect.

Based on the foregoing discovery, the following invention is provided.

1) A sintered compact magnesium oxide target for sputtering having a purity of 99.99 wt % or higher excluding C, a density of 3.57 g/cm$^3$ or higher, and a whiteness of 60% or less.

2) The sintered compact magnesium oxide target for sputtering according to 1) above, wherein the sintered compact magnesium oxide target for sputtering is produced by using a raw material obtained by adding MgCO$_3$ in an amount of 5 wt % or more and less than 30 wt % to magnesium oxide (MgO).

3) The sintered compact magnesium oxide target for sputtering according to 1) or 2) above, wherein the whiteness is 55% or higher and 60% or less.

4) The sintered compact magnesium oxide target for sputtering according to any one of 1) to 3) above, wherein variation in the whiteness is within 5%.

5) A method for producing a sintered compact magnesium oxide target for sputtering which uses a raw material obtained by adding MgCO$_3$ in an amount of 5 wt % or more and less than 30 wt % to magnesium oxide (MgO), wherein raw material powders made of magnesium oxide (MgO) and MgCO$_3$ having a purity of 99.99 wt % or higher excluding C and an average grain size of 0.5 μm or less are mixed, and the mixed powders are hot pressed at a temperature of 1500° C. or less and an applied pressure of 300 kgf/cm$^2$ or more to obtain a sintered compact magnesium oxide target for sputtering having a purity of 99.99 wt % or higher excluding C, and a density of 3.57 g/cm$^3$ or higher.

6) A method for producing the sintered compact magnesium oxide target for sputtering according to any one of 1) to 4) above which uses a raw material obtained by adding MgCO$_3$ in an amount of 5 wt % or more and less than 30 wt % to magnesium oxide (MgO), wherein raw material powders made of magnesium oxide (MgO) and MgCO$_3$ having a purity of 99.99 wt % or higher excluding C and an average grain size of 0.5 μm or less are mixed, and the mixed powders are hot pressed at a temperature of 1500° C. or less and an applied pressure of 300 kgf/cm$^2$ or more to obtain a sintered compact magnesium oxide target for sputtering having a purity of 99.99 wt % or higher excluding C, and a density of 3.57 g/cm$^3$ or higher.

The present invention is effective in uniformly depositing a magnesium oxide film, and specifically provides a high purity, high density sintered compact magnesium oxide target that is free of color shading and can be produced at a low cost by selecting the appropriate raw material powders. It is also possible to obtain a high density target having a uniform composition. Moreover, the generation of particles during sputtering can be consequently inhibited. In addition, since it is possible to produce a sintered compact magnesium oxide target comprising a moderate oxygen defect, excessive oxygen is not generated during sputtering, and an effect of inhibiting oxidation of the adjacent deposition layer (metal layer) is exhibited.

DETAILED DESCRIPTION

Figure 1:
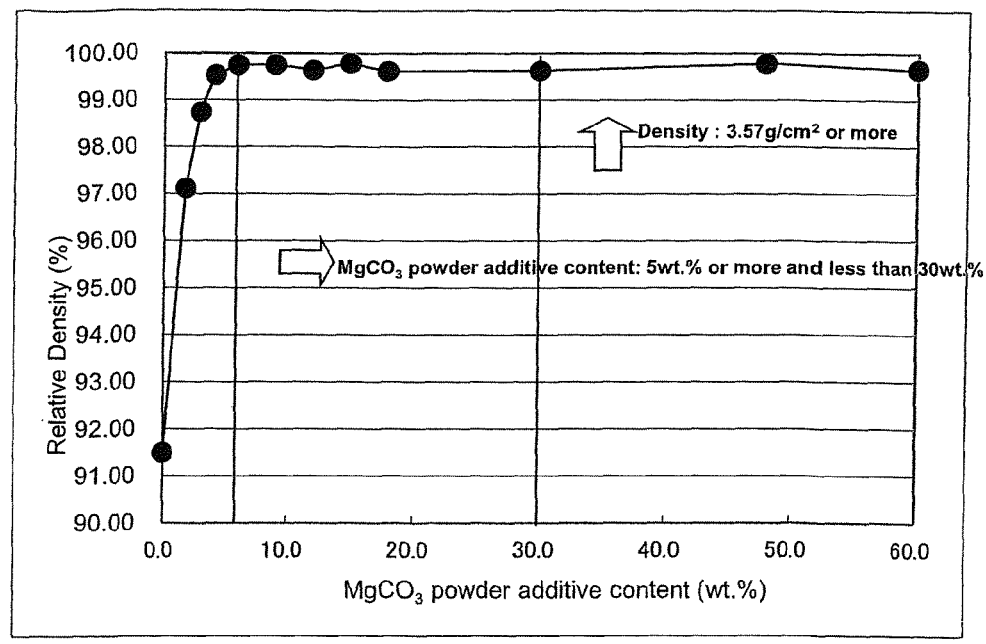
FIG. 1 is a diagram showing the correlation of the additive amount of magnesium carbonate (MgCO$_3$) and the relative density of the sintered compact magnesium oxide target.

The sintered compact magnesium oxide target for sputtering of the present invention has a purity of 99.99 wt % or higher excluding C, a density of 3.57 $g/cm^3$ or higher, and a whiteness of 60% or less, and a major feature of the present invention is that the sintered compact magnesium oxide target for sputtering has a whiteness of 55% or higher and 60% or less.

This target can be realized by producing the target using a raw material obtained by adding $MgCO_3$ in an amount of 5 wt % or more and less than 30 wt % to magnesium oxide (MgO). Note that the whiteness was measured using the micro surface spectral color difference meter VSS400 (JIS Z 8722, ASTM E 308) manufactured by Nippon Denshoku Industries. This Hunter-type color difference meter was used to measure L: luminosity and a·b (hue·chroma), and the whiteness was obtained from the following formula.

$$W \text{ (whiteness)} = 100 - [(100-L)^2 + (a^2 + b^2)]^{1/2} \quad \text{Formula}$$

Conventionally, magnesium oxide (MgO) was sintered, but sufficient density could not be obtained unless the sintering temperature was set high. The present invention can achieve a density of 3.57 $g/cm^3$ or more with a sintering temperature of 1500° C. or less as described below. This is a low temperature compared to conventional methods, and thus it is possible to reduce the production cost. In addition, the present invention can obtain a sintered compact magnesium oxide target for sputtering having a purity of 99.99% or higher excluding C.

As described above, it is even more advantageous to have an effect of reducing the nodules and particles because reduction of the variation in whiteness causes improvement in the uniformity of the sintered compact. Here, the variation in whiteness is preferably adjusted to be within 5%.

Upon producing the sintered compact magnesium oxide target for sputtering of the present invention, a $MgCO_3$ raw material in an amount of 5 wt % or more and less than 30 wt % is used. This raw material has a purity of 99.99 wt % or higher excluding C, and, after mixing the $MgCO_3$ raw material powders having an average grain size of 0.5 μm or less, the mixed powders are hot pressed at a temperature of 1500° C. or less and an applied pressure of 300 $kgf/cm^2$ or more to obtain a target having a purity of 99.99 wt % or higher excluding C, and a density of 3.57 $g/cm^3$ or higher. Note that magnesium carbonate ($MgCO_3$) is decomposed during sintering ($MgCO_3 \rightarrow MgO + CO_2$).

EXAMPLES

The Examples are now explained. Note that these Examples merely illustrate preferred representative examples, and it should be easy to understand that the present invention should not be limited to these Examples. The technical concept of the present invention shall be interpreted based on the overall descriptions of this specification and particularly based on the scope of claims.

Example 1

The sintered compact magnesium oxide target for sputtering was produced according to the following method. A raw material powder containing $MgCO_3$ in an amount of 6.0 wt % and remainder being magnesium oxide (MgO) having a purity of 99.99 wt % or higher excluding C and an average grain size of 0.5 μm or less was mixed. Note that the C content in this raw material powder was 0.86 wt %.

Subsequently, this mixed powder was hot pressed for 2 hours at a temperature of 1500° C. and an applied pressure of 300 $kgf/cm^2$ to produce a magnesium oxide target having a purity of 99.99 wt % or higher excluding C. Note that, since magnesium carbonate ($MgCO_3$) is decomposed during sintering ($MgCO_3 \rightarrow MgO + CO_2$), magnesium carbonate ($MgCO_3$) does not exist in the sintered target. The density of the obtained MgO sintered compact was measured with the Archimedes method. Consequently, a density of 3.576 $g/cm^3$ (relative density 99.74%) was obtained.

The sintered compact produced as described above was subject to grinding and polishing to obtain a sintered compact magnesium oxide target for sputtering. Upon visually observing the target, the color was gray, and the target possessed optical transparency. Moreover, upon examining the whiteness of the target, the whiteness was 58.6%. In addition, the variation in whiteness was 3.9%. For this whiteness, the whiteness by Hunter (Lab) was obtained by using the "micro surface spectral color difference meter VSS400" manufactured by Nippon Denshoku Industries. The measuring range diameter in the foregoing case was 0.2 mmφ. Three points were randomly measured to obtain the average value and variation (σ) thereof. In the following Examples and Comparative Examples, the whiteness was measured and the variation thereof was measured in a similar manner.

TABLE 1

| | Additive Amount of $MgCO_3$ Raw Material (wt. %) | Sintering Temperature (° C.) | Hold Time (Hours) | Pressing Pressure ($kgf/cm^2$) | Sintered Compact Density ($g/cm^3$) | Relative Density (%) | Color | Optical Transparency | Whiteness (%) | Variation in Whiteness (%) | C Content in Raw Material (wt. %) |
|---|---|---|---|---|---|---|---|---|---|---|---|
| Comparative Example 1 | 0.0 | 1500 | 2 | 300 | 3.280 | 91.49 | White | No | 91.3 | 1.4 | 0.00 |
| Comparative Example 2 | 1.8 | 1500 | 2 | 300 | 3.482 | 97.11 | White | No | 81.5 | 1.6 | 0.26 |
| Comparative Example 3 | 3.0 | 1500 | 2 | 300 | 3.540 | 98.74 | Light gray, spots | Yes | 72.2 | 10.5 | 0.43 |
| Comparative Example 4 | 4.2 | 1500 | 2 | 300 | 3.568 | 99.53 | Light gray | Yes | 63.5 | 0.3 | 0.60 |
| Example 1 | 6.0 | 1500 | 2 | 300 | 3.576 | 99.74 | Gray | Yes | 58.6 | 3.9 | 0.86 |
| Example 2 | 9.0 | 1500 | 2 | 300 | 3.576 | 99.75 | Gray | Yes | 57.6 | 0.6 | 1.28 |
| Example 3 | 12.0 | 1500 | 2 | 300 | 3.572 | 99.64 | Gray | Yes | 55.6 | 3.2 | 1.71 |

TABLE 1-continued

| | Additive Amount of MgCO$_3$ Raw Material (wt. %) | Sintering Temperature (° C.) | Hold Time (Hours) | Pressing Pressure (kgf/cm$^2$) | Sintered Compact Density (g/cm$^3$) | Relative Density (%) | Color | Optical Transparency | Whiteness (%) | Variation in Whiteness (%) | C Content in Raw Material (wt. %) |
|---|---|---|---|---|---|---|---|---|---|---|---|
| Example 4 | 15.0 | 1500 | 2 | 300 | 3.577 | 99.79 | Gray | Yes | 56.6 | 1.1 | 2.14 |
| Example 5 | 18.0 | 1500 | 2 | 300 | 3.571 | 99.62 | Gray | Yes | 56.1 | 3.4 | 2.57 |
| Comparative Example 5 | 30.0 | 1500 | 2 | 300 | 3.572 | 99.62 | Gray, spots | Yes | 56.5 | 5.2 | 4.28 |
| Comparative Example 6 | 48.0 | 1500 | 2 | 300 | 3.577 | 99.78 | Gray, spots | Yes | 56.4 | 6.8 | 6.84 |
| Comparative Example 7 | 60.0 | 1500 | 2 | 300 | 3.573 | 99.65 | Gray, spots, cracks | Yes | 56.6 | 8.1 | 8.55 |

Example 2

The sintered compact magnesium oxide target for sputtering was produced according to the following method. A raw material powder containing MgCO$_3$ in an amount of 9.0 wt % and remainder being magnesium oxide (MgO) having a purity of 99.99 wt % or higher excluding C and an average grain size of 0.5 μm or less was mixed. Note that the C content in this raw material powder was 1.28 wt %.

Subsequently, this mixed powder was hot pressed for 2 hours at a temperature of 1500° C. and an applied pressure of 300 kgf/cm$^2$ to produce a magnesium oxide target having a purity of 99.99 wt % or higher excluding C. Note that, since magnesium carbonate (MgCO$_3$) is decomposed during sintering (MgCO$_3$→MgO+CO$_2$), magnesium carbonate (MgCO$_3$) does not exist in the sintered target. The density of the obtained MgO sintered compact was measured with the Archimedes method. Consequently, a density of 3.576 g/cm$^3$ (relative density 99.75%) was obtained.

The sintered compact produced as described above was subject to grinding and polishing to obtain a sintered compact magnesium oxide target for sputtering. Upon visually observing the target, the color was gray, and the target possessed optical transparency. Moreover, upon examining the whiteness of the target, the whiteness was 57.6%. In addition, the variation in whiteness was 0.6%.

Example 3

The sintered compact magnesium oxide target for sputtering was produced according to the following method. A raw material powder containing MgCO$_3$ in an amount of 12.0 wt % and remainder being magnesium oxide (MgO) having a purity of 99.99 wt % or higher excluding C and an average grain size of 0.5 μm or less was mixed. Note that the C content in this raw material powder was 1.71 wt %.

Subsequently, this mixed powder was hot pressed for 2 hours at a temperature of 1500° C. and an applied pressure of 300 kgf/cm$^2$ to produce a magnesium oxide target having a purity of 99.99 wt % or higher excluding C. Note that, since magnesium carbonate (MgCO$_3$) is decomposed during sintering (MgCO$_3$→MgO+CO$_2$), magnesium carbonate (MgCO$_3$) does not exist in the sintered target. The density of the obtained MgO sintered compact was measured with the Archimedes method. Consequently, a density of 3.572 g/cm$^3$ (relative density 99.64%) was obtained.

The sintered compact produced as described above was subject to grinding and polishing to obtain a sintered compact magnesium oxide target for sputtering. Upon visually observing the target, the color was gray, and the target possessed optical transparency. Moreover, upon examining the whiteness of the target, the whiteness was 55.6%. In addition, the variation in whiteness was 3.2%.

Example 4

The sintered compact magnesium oxide target for sputtering was produced according to the following method. A raw material powder containing MgCO$_3$ in an amount of 15.0 wt % and remainder being magnesium oxide (MgO) having a purity of 99.99 wt % or higher excluding C and an average grain size of 0.5 μm or less was mixed. Note that the C content in this raw material powder was 2.14 wt %.

Subsequently, this mixed powder was hot pressed for 2 hours at a temperature of 1500° C. and an applied pressure of 300 kgf/cm$^2$ to produce a magnesium oxide target having a purity of 99.99 wt % or higher excluding C. Note that, since magnesium carbonate (MgCO$_3$) is decomposed during sintering (MgCO$_3$→MgO+CO$_2$), magnesium carbonate (MgCO$_3$) does not exist in the sintered target. The density of the obtained MgO sintered compact was measured with the Archimedes method. Consequently, a density of 3.577 g/cm$^3$ (relative density 99.79%) was obtained.

The sintered compact produced as described above was subject to grinding and polishing to obtain a sintered compact magnesium oxide target for sputtering. Upon visually observing the target, the color was gray, and the target possessed optical transparency. Moreover, upon examining the whiteness of the target, the whiteness was 56.6%. In addition, the variation in whiteness was 1.1%.

Example 5

The sintered compact magnesium oxide target for sputtering was produced according to the following method. A raw material powder containing MgCO$_3$ in an amount of 18.0 wt % and remainder being magnesium oxide (MgO) having a purity of 99.99 wt % or higher excluding C and an average grain size of 0.5 μm or less was mixed. Note that the C content in this raw material powder was 2.57 wt %.

Subsequently, this mixed powder was hot pressed for 2 hours at a temperature of 1500° C. and an applied pressure of 300 kgf/cm$^2$ to produce a magnesium oxide target having a purity of 99.99 wt % or higher excluding C. Note that, since magnesium carbonate (MgCO$_3$) is decomposed during sintering (MgCO$_3$→MgO+CO$_2$), magnesium carbonate (MgCO$_3$) does not exist in the sintered target. The density of the obtained MgO sintered compact was measured with the Archimedes method. Consequently, a density of 3.571 g/cm$^3$ (relative density 99.62%) was obtained.

The sintered compact produced as described above was subject to grinding and polishing to obtain a sintered compact magnesium oxide target for sputtering. Upon visually observing the target, the color was gray, and the target possessed optical transparency. Moreover, upon examining the whiteness of the target, the whiteness was 56.1%. In addition, the variation in whiteness was 3.4%.

Comparative Example 1

The sintered compact magnesium oxide target for sputtering was produced according to the following method. A raw material powder containing magnesium oxide (MgO) having a purity of 99.99 wt % or higher and an average grain size of 0.5 µm or less was used. Note that magnesium carbonate ($MgCO_3$) was not added to this raw material powder. C content was <10 ppm.

Subsequently, this raw material powder was hot pressed for 2 hours at a temperature of 1500° C. and an applied pressure of 300 kgf/cm$^2$ to produce a magnesium oxide target having a purity of 99.99 wt % or higher excluding C. The density of the obtained MgO sintered compact was measured with the Archimedes method. Consequently, a density of 3.280 g/cm$^3$ (relative density 91.49%) was obtained. In comparison to the Examples, the density decreased significantly.

The sintered compact produced as described above was subject to grinding and polishing to obtain a sintered compact magnesium oxide target for sputtering. Upon visually observing the target, the color was white, and the target did not possess optical transparency. Moreover, upon examining the whiteness of the target, the whiteness was 91.3%. In addition, the variation in whiteness was 1.4%.

Comparative Example 2

The sintered compact magnesium oxide target for sputtering was produced according to the following method. A raw material powder containing magnesium oxide (MgO) and magnesium carbonate ($MgCO_3$) in an amount of 0.18 wt % having a purity of 99.99 wt % or higher excluding C and an average grain size of 0.5 µm or less was mixed. C content was 0.26 wt %. In the foregoing case, the amount of magnesium carbonate ($MgCO_3$) did not satisfy the amount of the present invention.

Subsequently, this mixed powder was hot pressed for 2 hours at a temperature of 1500° C. and an applied pressure of 300 kgf/cm$^2$ to produce a magnesium oxide target having a purity of 99.99 wt % or higher excluding C. Note that, since magnesium carbonate ($MgCO_3$) is decomposed during sintering ($MgCO_3 \rightarrow MgO+CO_2$), magnesium carbonate ($MgCO_3$) does not exist in the sintered target. The density of the obtained MgO sintered compact was measured with the Archimedes method. Consequently, a density of 3.482 g/cm$^3$ (relative density 97.11%) was obtained. In comparison to the Examples, the density decreased significantly.

The sintered compact produced as described above was subject to grinding and polishing to obtain a sintered compact magnesium oxide target for sputtering. Upon visually observing the target, the color was white, and the target did not possess optical transparency. Moreover, upon examining the whiteness of the target, the whiteness was 81.5%. In addition, the variation in whiteness was 1.6%.

Comparative Example 3

The sintered compact magnesium oxide target for sputtering was produced according to the following method. A raw material powder containing magnesium oxide (MgO) and magnesium carbonate ($MgCO_3$) in an amount of 3.0 wt % having a purity of 99.99 wt % or higher excluding C and an average grain size of 0.5 µm or less was mixed. C content was 0.43 wt %. In the foregoing case, the amount of magnesium carbonate ($MgCO_3$) did not satisfy the amount of the present invention.

Subsequently, this mixed powder was hot pressed for 2 hours at a temperature of 1500° C. and an applied pressure of 300 kgf/cm$^2$ to produce a magnesium oxide target having a purity of 99.99 wt % or higher excluding C. Note that, since magnesium carbonate ($MgCO_3$) is decomposed during sintering ($MgCO_3 \rightarrow MgO+CO_2$), magnesium carbonate ($MgCO_3$) does not exist in the sintered target. The density of the obtained MgO sintered compact was measured with the Archimedes method. Consequently, a density of 3.540 g/cm$^3$ (relative density 98.74%) was obtained. In comparison to the Examples, the density decreased.

The sintered compact produced as described above was subject to grinding and polishing to obtain a sintered compact magnesium oxide target for sputtering. Upon visually observing the target, the color was light gray but "spots" appeared on the surface. The target possessed optical transparency.

Moreover, upon examining the whiteness of the target, the whiteness was 72.2%. In addition, the variation in whiteness was 10.5%.

Comparative Example 4

The sintered compact magnesium oxide target for sputtering was produced according to the following method. A raw material powder containing magnesium oxide (MgO) and magnesium carbonate ($MgCO_3$) in an amount of 4.2 wt % having a purity of 99.99 wt % or higher excluding C and an average grain size of 0.5 µm or less was mixed. C content was 0.60 wt %. In the foregoing case, the amount of magnesium carbonate ($MgCO_3$) did not satisfy the amount of the present invention.

Subsequently, this mixed powder was hot pressed for 2 hours at a temperature of 1500° C. and an applied pressure of 300 kgf/cm$^2$ to produce a magnesium oxide target having a purity of 99.99 wt % or higher excluding C. Note that, since magnesium carbonate ($MgCO_3$) is decomposed during sintering ($MgCO_3 \rightarrow MgO+CO_2$), magnesium carbonate ($MgCO_3$) does not exist in the sintered target. The density of the obtained MgO sintered compact was measured with the Archimedes method. Consequently, a density of 3.568 g/cm$^3$ (relative density 99.53%) was obtained. In comparison to the Examples, the density decreased.

The sintered compact produced as described above was subject to grinding and polishing to obtain a sintered compact magnesium oxide target for sputtering. Upon visually observing the target, the color was light gray, and the target possessed optical transparency. Moreover, upon examining the whiteness of the target, the whiteness was 63.5%. In addition, the variation in whiteness was 0.3%.

Comparative Example 5

The sintered compact magnesium oxide target for sputtering was produced according to the following method. A raw material powder containing magnesium oxide (MgO) and magnesium carbonate ($MgCO_3$) in an amount of 30.0 wt % having a purity of 99.99 wt % or higher excluding C and an average grain size of 0.5 µm or less was mixed. C content was 4.3 wt %. In the foregoing case, the amount of magnesium carbonate ($MgCO_3$) exceeds the amount of the present invention.

Subsequently, this mixed powder was hot pressed for 2 hours at a temperature of 1500° C. and an applied pressure of 300 kgf/cm² to produce a magnesium oxide target having a purity of 99.99 wt % or higher excluding C. Note that, since magnesium carbonate ($MgCO_3$) is decomposed during sintering ($MgCO_3 \rightarrow MgO + CO_2$), magnesium carbonate ($MgCO_3$) does not exist in the sintered target. The density of the obtained MgO sintered compact was measured with the Archimedes method. Consequently, a density of 3.572 g/cm³ (relative density 99.62%) was obtained, and the density was equivalent to the Examples.

The sintered compact produced as described above was subject to grinding and polishing to obtain a sintered compact magnesium oxide target for sputtering. Upon visually observing the target, the color was gray but "spots" appeared on the surface. This is considered to be a result of an increase in the amount of magnesium carbonate ($MgCO_3$). Moreover, upon examining the whiteness of the target, the whiteness was 56.5%. In addition, the variation in whiteness was 5.2%.

Comparative Example 6

The sintered compact magnesium oxide target for sputtering was produced according to the following method. A raw material powder containing magnesium oxide (MgO) and magnesium carbonate ($MgCO_3$) in an amount of 48.0 wt % having a purity of 99.99 wt % or higher excluding C and an average grain size of 0.5 µm or less was mixed. C content was 6.8 wt %. In the foregoing case, the amount of magnesium carbonate ($MgCO_3$) exceeds the amount of the present invention.

Subsequently, this mixed powder was hot pressed for 2 hours at a temperature of 1500° C. and an applied pressure of 300 kgf/cm² to produce a magnesium oxide target having a purity of 99.99 wt % or higher excluding C. Note that, since magnesium carbonate ($MgCO_3$) is decomposed during sintering ($MgCO_3 \rightarrow MgO + CO_2$), magnesium carbonate ($MgCO_3$) does not exist in the sintered target. The density of the obtained MgO sintered compact was measured with the Archimedes method. Consequently, a density of 3.577 g/cm³ (relative density 99.78%) was obtained, and the density was equivalent to the Examples.

The sintered compact produced as described above was subject to grinding and polishing to obtain a sintered compact magnesium oxide target for sputtering. Upon visually observing the target, the color was gray but "spots" appeared on the surface. This is considered to be a result of an increase in the amount of magnesium carbonate ($MgCO_3$). Moreover, upon examining the whiteness of the target, the whiteness was 56.4%. In addition, the variation in whiteness was 6.8%.

Comparative Example 7

The sintered compact magnesium oxide target for sputtering was produced according to the following method. A raw material powder containing magnesium oxide (MgO) and magnesium carbonate ($MgCO_3$) in an amount of 60.0 wt % having a purity of 99.99 wt % or higher excluding C and an average grain size of 0.5 µm or less was mixed. C content was 8.55 wt %. In the foregoing case, the amount of magnesium carbonate ($MgCO_3$) considerably exceeds the amount of the present invention.

Subsequently, this mixed powder was hot pressed for 2 hours at a temperature of 1500° C. and an applied pressure of 300 kgf/cm² to produce a magnesium oxide target having a purity of 99.99 wt % or higher excluding C. Note that, since magnesium carbonate ($MgCO_3$) is decomposed during sintering ($MgCO_3 \rightarrow MgO + CO_2$), magnesium carbonate ($MgCO_3$) does not exist in the sintered target. The density of the obtained MgO sintered compact was measured with the Archimedes method. Consequently, a density of 3.573 g/cm³ (relative density 99.65%) was obtained, and the density was equivalent to the Examples.

The sintered compact produced as described above was subject to grinding and polishing to obtain a sintered compact magnesium oxide target for sputtering. Upon visually observing the target, the color was gray but "spots" appeared on the surface. Moreover, cracks were generated in addition to the "spots". This is considered to be a result of an increase in the amount of magnesium carbonate ($MgCO_3$).

Moreover, upon examining the whiteness of the target, the whiteness was 56.6%. In addition, the variation in whiteness was 8.1%.

As evident from the foregoing Examples and Comparative Examples, the relative density of the sintered compact magnesium oxide target of the present invention is affected by the additive amount of the magnesium carbonate ($MgCO_3$). A density of 3.57 g/cm³ (relative density of 99.5%) can be achieved by adding $MgCO_3$ in an amount of 5 wt % or more and less than 30 wt %. This is shown in FIG. 1.

Figure 2:
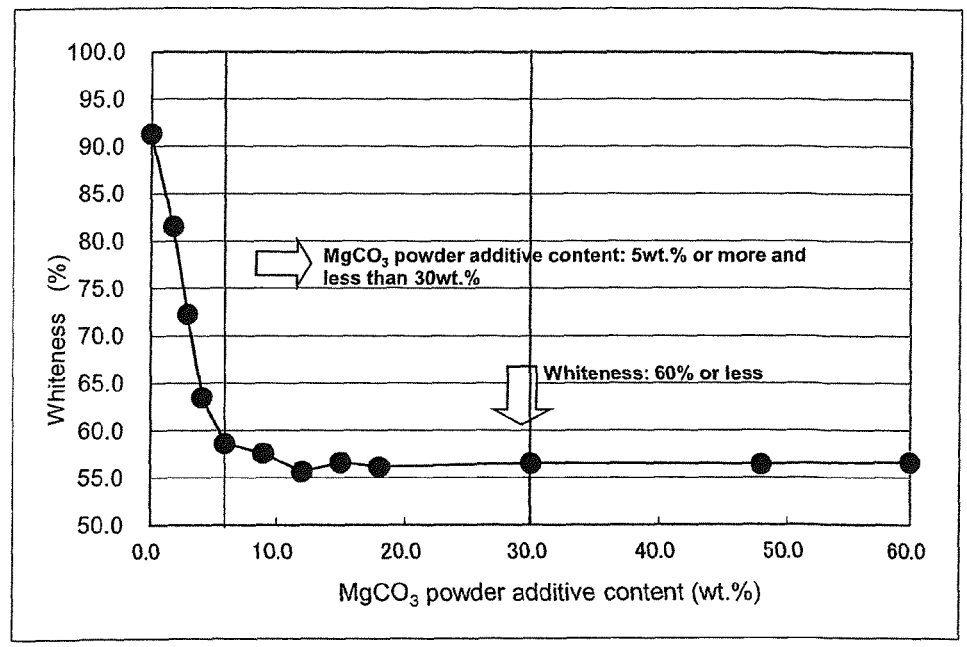
FIG. 2 is a diagram showing the correlation of the additive amount of magnesium carbonate ($MgCO_3$) and the whiteness of the sintered compact magnesium oxide target.

Moreover, the whiteness of the sintered compact magnesium oxide target of the present invention is affected by the additive amount of the magnesium carbonate ($MgCO_3$). The whiteness becomes 60% or less by adding $MgCO_3$ in an amount of 5 wt % or more and less than 30 wt %. This is shown in FIG. 2.

Accordingly, a target produced by using a raw material obtained by adding $MgCO_3$ in an amount of 5 wt % or more and less than 30 wt % to the magnesium oxide (MgO) has a high density, and is effective as a sintered compact magnesium oxide target for sputtering.

Moreover, as evident from the foregoing Examples and Comparative Examples, it is more effective to adjust the variation in whiteness to be within 5% since an effect of decreasing the cracks and nodules of the sintered compact can be obtained.

The present invention yields a superior effect of being able to obtain a high purity, high density sintered compact magnesium oxide target that is free of color shading and can be produced at a low cost by selecting the appropriate raw material powder. It is also possible to improve the characteristics of the deposition of magnesium oxide. Further, the generation of particles during sputtering can be consequently inhibited. In addition, since it is possible to produce a sintered compact magnesium oxide target comprising a moderate oxygen defect, excessive oxygen is not generated during sputtering, and an effect of inhibiting oxidation of the adjacent deposition layer (metal layer) is exhibited.

Accordingly, the magnesium oxide sintered compact sputtering target of the present invention is useful as a magnesium oxide sputtering target for use in forming a magnesium oxide layer for magnetic recording mediums of magnetic disk devices or tunneling magnetoresistance (TMR) elements and other electronic devices.

The invention claimed is:
1. A sputtering target comprising a sintered compact of magnesium oxide having a purity of 99.99 wt % or higher excluding C, a density of 3.57 g/cm³ or higher, and a whiteness of 60% or less.

2. The sputtering target according to claim 1, wherein the sintered compact of magnesium oxide is produced by sintering a raw material powder obtained by mixing a magnesium oxide (MgO) powder with a magnesium carbonate ($MgCO_3$) powder of an amount of 5 wt % or more and less than 30 wt %.

3. The sputtering target according to claim 2, wherein the whiteness is 55% or higher and 60% or less.

4. The sputtering target according to claim 3, wherein the whiteness has a variation within 5%.

5. The sputtering target according to claim 1, wherein the whiteness is 55% or higher and 60% or less.

6. The sputtering target according to claim 1, wherein in the whiteness has a variation within 5%.

* * * * *